(12) United States Patent
Zhang

(10) Patent No.: US 11,349,962 B2
(45) Date of Patent: May 31, 2022

(54) DATA TRANSMISSION METHOD AND DEVICE

(71) Applicant: Xi'An Zhongxing New Software Co., Ltd., Shaanxi (CN)

(72) Inventor: Lu Zhang, Shenzhen (CN)

(73) Assignee: XI'AN ZHONGXING NEW SOFTWARE CO., LTD., Xi'An (CN)

( * ) Notice: Subject to any disclaimer, the term of this patent is extended or adjusted under 35 U.S.C. 154(b) by 123 days.

(21) Appl. No.: 16/628,653

(22) PCT Filed: Apr. 2, 2018

(86) PCT No.: PCT/CN2018/081517
§ 371 (c)(1),
(2) Date: Jan. 3, 2020

(87) PCT Pub. No.: WO2019/007114
PCT Pub. Date: Jan. 10, 2019

(65) Prior Publication Data
US 2021/0250427 A1 Aug. 12, 2021

(30) Foreign Application Priority Data
Jul. 3, 2017 (CN) .......................... 201710532541.2

(51) Int. Cl.
*H04B 1/66* (2006.01)
*H04L 69/04* (2022.01)

(52) U.S. Cl.
CPC .................................. *H04L 69/04* (2013.01)

(58) Field of Classification Search
CPC ...................................................... H04L 69/04

USPC ......................................................... 375/240
See application file for complete search history.

(56) References Cited

U.S. PATENT DOCUMENTS

| 5,812,202 A * | 9/1998 | Ng | ........................ | H04N 7/0112 348/446 |
| 7,995,696 B1 | 8/2011 | Norrie | | |
| 2011/0299767 A1* | 12/2011 | Ichikawa | ............... | H04N 19/46 382/162 |

(Continued)

FOREIGN PATENT DOCUMENTS

| CN | 101577682 A | 11/2009 |
| CN | 102487529 A | 6/2012 |

(Continued)

OTHER PUBLICATIONS

Machine English Translation of CN103873443A. Jun. 18, 2014. pp. 1-13. (Year: 2021).*

(Continued)

*Primary Examiner* — Don N Vo
(74) *Attorney, Agent, or Firm* — Morgan, Lewis & Bockius LLP

(57) ABSTRACT

Provided are a data transmission method and device. The method includes: processing a first data packet to be sent by using a compression strategy obtained in advance from a receiving end, deleting specified duplicated data comprised in the compression strategy in the first data packet; generating a second data packet to be sent from the processed first data packet, where the second data packet includes a modification record field for indicating the deleted duplicated data; and sending the second data packet to the receiving end.

19 Claims, 9 Drawing Sheets

(56) References Cited

U.S. PATENT DOCUMENTS

| | | | |
|---|---|---|---|
| 2014/0064180 A1 | 3/2014 | Kotecha et al. | |
| 2014/0211813 A1* | 7/2014 | Gochi Garcia | H04L 67/02 370/477 |
| 2017/0262221 A1* | 9/2017 | Zhao | G06F 3/0647 |
| 2018/0146059 A1* | 5/2018 | Schoenberg | H04L 67/1097 |

FOREIGN PATENT DOCUMENTS

| | | |
|---|---|---|
| CN | 103873443 A | 6/2014 |
| CN | 106302245 A | 1/2017 |
| CN | 107332909 A | 11/2017 |
| EP | 2774340 A | 9/2014 |

OTHER PUBLICATIONS

Extended European Search Report for Application No. 18827476.5, dated Dec. 14, 2020, 10 pages.
International Search Report for Application No. PCT/CN2018/081517, dated Jun. 27, 2018, 4 pages.

* cited by examiner

| Content-type policy table (Destination IP: 10.9.9.2) | | |
|---|---|---|
| C-Policy1 | C-Policy2 | C-Policy3 |
| Port number A | Port number B | Port number C |
| Offset1 | Offset1 | Offset1 |
| Len1 | Len1 | Len1 |
| Value1 | Value1 | Value1 |
| Offset2 | Offset2 | Offset2 |
| Len2 | Len2 | Len2 |
| Value2 | Value2 | Value2 |

FIG.5

| 1 bit | 1 bit | 6 bit |
|---|---|---|
| Policy enable indication | Policy type | Policy number |

0-Not processed    0-Protocol-type policy    Policy number, a value ranges from 0 to 63
1-Processed        1-Content-type policy

FIG.6

DATA TRANSMISSION METHOD AND DEVICE

CROSS REFERENCE TO RELATED APPLICATIONS

This application is a U.S. National Stage Application, filed under 35 U.S.C. 371, of International Patent Application No. PCT/CN2018/081517, filed on Apr. 2, 2018, which claims a priority to a Chinese patent application No. 201710532541.2 filed on Jul. 3, 2017, disclosure of which are incorporated herein by reference in their entireties.

TECHNICAL FIELD

The present disclosure relates to the field of telecommunication technology of Internet of Things and, for example, relates to a data transmission method and a data transmission device.

BACKGROUND

Internet of Things (IoT) is a major trend in the development of communication technology. On one hand, not only large-scale specification organizations such as the 3rd generation partnership project (3GPP), but also network operators and terminal manufacturers in various countries have begun to seek technology directions of low-speed, low-bandwidth and low-power-consumption. On the other hand, the IoT has very strict requirements on terminal power consumption. Therefore, improving data transmission efficiency, reducing power consumption and prolonging battery lifetime of terminal equipment are important research directions.

Solutions in the existing art basically are standard transmission control protocol/internet protocol (TCP/IP) and wireless protocol transmission solutions of the 3GPP. In view of IoT characteristics, 3GPP has also proposed to optimize transmission-related characteristics in an enhanced machine-type communication (eMTC) protocol and a cellular-based narrowband Internet of Things (NB-IoT) protocol, such as transmitting small data through a signaling plane to reduce a number of radio bearer establishments of a terminal from an idle state to a connection state and speed up the transmission.

In 3GPP standards, basically two characteristics exist for each of the methods for reducing power consumption and optimizing transmission efficiency. One is that terminal underlying hardware support is required and the implementation is complex. The other is that the methods need be implemented by corresponding functional modules at both of the terminal side and the network side; however, realization of the functions need be promoted by standards organizations and supported by network operators, resulting in a high cost.

SUMMARY

Embodiments of the present disclosure provide a data transmission method and device, which are able to easily implement reducing the amount of data actually transmitted, and have a low cost.

An embodiment of the present disclosure provides a data transmission method. The method includes:
processing a first data packet to be sent by using a compression strategy obtained in advance from a receiving end, deleting specified duplicated data included in the compression strategy in the first data packet;
generating a second data packet to be sent from the processed first data packet, where the second data packet includes a modification record field for indicating the deleted duplicated data; and
sending the second data packet to the receiving end.

An embodiment of the present disclosure further provides a data transmission method. The method includes:
receiving a second data packet from a sending end, and checking that the second data packet carries a modification record field which is used for indicating duplicated data deleted by the sending end according to a compression strategy obtained in advance;
performing a recovery processing on the second data packet according to the modification record field and the compression strategy to generate a first data packet.

An embodiment of the present disclosure further provides a data transmission device, including: a compression module, a processing module, a sending module, and a first storage module configured to store a compression strategy obtained from a receiving end in advance.

The compression module is configured to process a first data packet to be sent by using a compression strategy in a first storage module, delete specified duplicated data included in the compression strategy in the first data packet.

The processing module is configured to generate a second data packet to be sent from the processed first data packet, where the second data packet includes a modification record field for indicating the deleted duplicated data.

The sending module is configured to send the second data packet.

An embodiment of the present disclosure further provides a terminal, which includes the data transmission device provided by any embodiment described above. An embodiment of the present disclosure further provides a computer-readable storage medium storing computer-executable instructions for executing the method described above.

The data transmission method provided in the embodiments of the present disclosure deletes information repeatedly sent in a data packet to be sent, and reduces the amount of data actually transmitted. The method provided by the embodiments of the present disclosure does not need additional hardware support, and simply reduces the amount of data actually transmitted, thereby saving the cost.

BRIEF DESCRIPTION OF DRAWINGS

FIG. 5 is a structure diagram of a content-type policy provided by an embodiment of the present disclosure;

FIG. 6 is a structural diagram of decompression information according to an embodiment of the present disclosure;

DETAILED DESCRIPTION

Embodiments of the present disclosure will be described below in conjunction with the drawings.

Data transmission in IoT application scenarios is special.

For example, the pertinence of IoT terminal functions determines the regularity of transmitted data packets. For example, most of data packets interacted by a Tracker-type device for positioning with a network side are position information of a user; and most of data packets interacted by a water and gas meter for metering, i.e., a Meter-type device with the network side are statistical information of metering data. Compared with complex mobile terminals such as mobile phones, the format and type of data transmitted by these IoT terminals are relatively single.

For another example, a ratio of contents of IoT uplink data packets is relatively large. Radio IoT terminal and sensor are closely related and usually have features of collecting data and reporting the data to the server. For example, a meter reader periodically sends the metering data or a locator reports position information. Unlike mobile terminals such as mobile phones and iPads mainly receiving data, i.e., downlink data, in terms of data volume and user intention, the IoT terminal often needs to report data collected by the sensor, so a ratio of uplink data is relatively large. The IoT terminal often interacts with the network periodically and spontaneously in a case where the user does not actively interfere, generally the IoT terminal continuously works over many years. In this way, the total amount of data is very large. And compared with receiving, data sending causes larger power consumption to the terminal than data receiving. Therefore, optimization of IoT uplink data transmission is very meaningful for power consumption optimization of the overall system.

For another example, IoT applications are usually client/server structures. Application providers usually need to provide terminals and application servers. With the in-depth technical study of the IoT, some new solutions for transmission optimizing are also emerged, but basically all of them need cooperation of terminals and network elements on a radio side, i.e., requiring special hardware support from network operators. This technology is quite complicated to be implemented and generally requires vigorous promotion of large international agreement organizations and equipment manufacturers.

Figure 1:
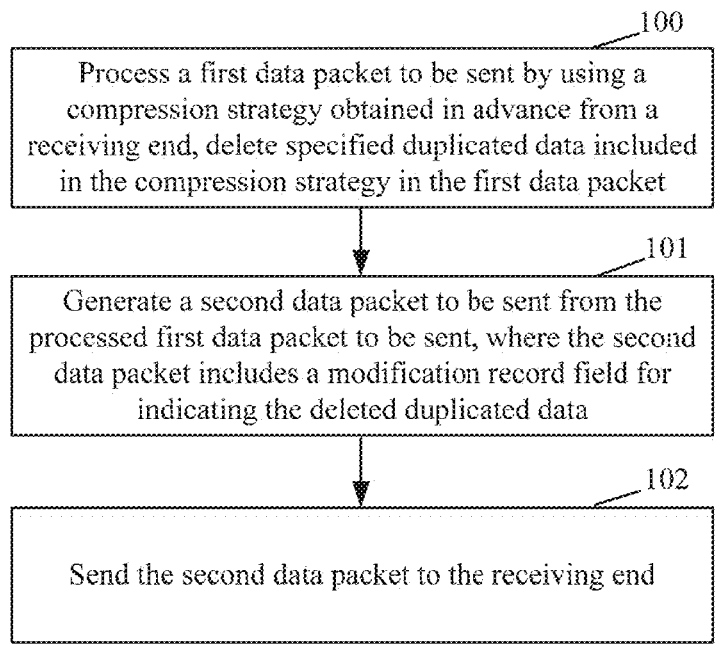
FIG. 1 is a flowchart of a data transmission method provided by an embodiment of the present disclosure.

FIG. 1 is a flowchart of a data transmission method provided by an embodiment of the present disclosure. The method shown in FIG. 1 may be applicable to a sending end (such as a terminal side). As shown in FIG. 1, the method provided by the embodiment includes the steps described below.

In step 100, a first data packet to be sent is processed by using a compression strategy obtained in advance from a receiving end, specified duplicated data included in the compression strategy in the first data packet is deleted.

The compression strategy includes one or more policies, which is used as basis information to compare whether the first data packet to be sent by the sending end includes duplicated content with a previously sent data packet, and is basis information used by the receiving end to recover received compressed second data packet to form the original first data packet.

In an embodiment, this step may include:

when a first data packet to be sent is provided at the sending end, periodically comparing the first data packet with a policy of which a destination address is consistent with a destination address of the first data packet in the compression strategy, and checking whether a field or a content which is the same as a field or a content described in the policy exists in the first data packet;

if yes, that is, if it is checked out related field or content in the first data packet matches with the compression strategy, the field or the content which is the same as that described in the policy existing in the first data packet is deleted, i.e., deleting the content being duplicated with that of the previously sent data packet in the first data packet.

In an embodiment, if it is checked out the field or content which is the same as that described in the policy does not exist in the first data packet, the policy in the compression strategy is deleted.

In an embodiment, the compression strategy at least includes: a protocol-type policy distinguished by a protocol type, and a content-type policy distinguished by an application type.

One sending end at most includes two-types of policies for one destination IP (Internet Protocol) address: one is the protocol-type policy, and the other is the content-type policy. In the two types of policies, the protocol-type policy includes one or more protocol-type policies, and the content-type policy includes one or more content-type policies. Multiple policies within a type of policies are marked with different numbers which are called policy numbers.

The sending end (such as a terminal) may have multiple compression strategies for different destination IP addresses; and the receiving end (such as a server) also has multiple compression strategies for different terminals. A server and a terminal have corresponding compression strategies, and the policy number of each policy in the compression strategy of the server is exactly the same as that of a corresponding policy in the compression strategy of the terminal.

When the compression strategy includes the protocol-type policy and the content-type policy, the step 100 includes:

when a first data packet to be sent is provided at the sending end, if the compression strategy stores a protocol-type policy of which a destination address is consistent with a destination address of the first data packet to be sent, periodically comparing the first data packet to be sent with the protocol-type policy of which the destination address is consistent with the destination address of the first data packet to be sent in the compression strategy, and checking whether a field or a content which is the same as that described in the protocol-type policy exists in the first data packet, if yes, i.e., it is checked out that corresponding field or content in the first data packet matches with the compression strategy, deleting the field or the content which is the same as that described in the protocol-type policy existing in the first data packet, i.e., deleting the content being duplicated with that of the previously sent data packet in the first data packet.

in response to determining that the compression strategy does not store the protocol-type policy of which the destination address is consistent with the destination address of the first data packet to be sent, but stores a content-type policy of which the destination address is consistent with the destination address of the first data packet to be sent, periodically comparing the first data packet to be sent with the content-type policy of which the destination address is consistent with the destination address of the first data packet to be sent in the compression strategy, and checking whether a specified content in the first data packet is the same as a corresponding content described in the content-type policy. If yes, i.e., the specified field or content in the first data packet is checked out to be matched with the compression strategy, deleting the corresponding field or content in the first data packet, i.e., deleting the content being duplicated with that of the previously sent data packet in the first data packet.

In step 100, after the first data packet to be sent exists and before the first data packet to be sent is processed, the method further includes: querying whether the receiving end supports compression transmission capability.

In an embodiment, confirming that the receiving end supports the compression transmission capability includes: sending a query request to the receiving end, and after receiving a response from the receiving end, determining that the receiving end supports the compression transmission capability; or querying a data transmission record with the receiving end, and determining that the receiving end supports the compression transmission capability according to the data transmission record.

For a first query method, the sending end sends the query request to the receiving end. If the sending end does not receive a query response, it is considered that the receiving end does not support the compression transmission capability; if the sending end receives a query response, it is considered that the receiving end supports the compression transmission capability.

For a second query method, if the sending end stores a record of data transmission with the receiving end and the record shows that the receiving end supports the compression transmission capability, the process goes to the step 100.

If the sending end does not store the record of data transmission with the receiving end, it indicates that the sending end communicates with the destination IP address corresponding to the first data packet to be sent for the first time. The sending end needs to query whether the receiving end supports the compression transmission capability through a control path: for the receiving end supports the compression transmission capability, the process goes to the step of processing the first data packet to be sent in step 100; for the receiving end does not support the compression transmission capability, the process of the embodiment of the present disclosure is ended, and the first data packet to be sent is sent by using a common data transmission mode in related technology.

In an embodiment, in order to avoid message sending failure due to network reasons, querying whether the receiving end supports the compression transmission capability may further include that: the sending end sends a preset number of query requests (such as three times) to the server according to a preset time interval (such as 2 seconds). If the sending end does not receive any query response, it is considered that the receiving end does not support the compression transmission capability; if the sending end receives at least one query response, it is considered that the receiving end supports the compression transmission capability. In an embodiment, the time interval and the number of sending may be configured according to application scenarios.

Before step 100, the method 100 further includes that: the sending end acquires the compression strategy from the receiving end through the control path. That is, synchronization of policies in the compression strategies between the receiving end and the sending end is implemented. In an embodiment, after obtaining the compression strategy, the sending end may return confirmation information to the receiving end. The control path is from a TCP/IP level, which is distinguished from a path for transmitting actual user data; the control path does not refer to a control plane of a 3GPP radio protocol stack, and the control path still belongs to a user plane. Here, the control path may be determined through a preset port.

In step 101, a second data packet to be sent is generated from the processed first data packet to be sent, where the second data packet includes a modification record field for indicating the deleted duplicated data.

The information in the modification record field is used for indicating which policy in the compression strategy is used by the sending end to process the first data packet to be sent. The modification record field occupies one byte. The modification record field may be configured at a start portion of a payload of the second data packet to be sent.

In an embodiment, the modification record field may include: a policy enable indication, which is used for indicating whether the second data packet in which the modification record field is located has been processed by the step 100, for example, if the second data packet is processed, the policy enable indication is valid and may be configured to be 1; if the second data packet is not processed, the policy enable indication is invalid and may be configured to be 0; a policy type indication, which is used for indicating a type of a policy adopted to process the first data packet, for example, the policy type indication is 0, indicating that the first data packet is processed by using the protocol-type policy, the policy type indication is 1, indicating that the first data packet is processed by using the content-type policy; and a policy number, which is used for indicating that which piece of policy is adopted to process the first data packet.

In step 102, the second data packet is sent to the receiving end.

Through the data transmission method provided by the embodiment of the present disclosure shown in FIG. 1, information repeatedly sent in a data packet to be sent is deleted, and the amount of data actually transmitted is reduced. The amount of data actually transmitted is reduced and has a role of reducing the payload of the user plane of the operator network, thus the productization of technical solutions of the embodiment of the present disclosure is very easy. The method provided by the embodiment of the present disclosure is directly applied between two final nodes of the terminal and the server, and is also transparent to the network operator. Therefore, the method may be directly applied without requiring the operator to additionally add software and hardware costs or additional hardware support. Therefore, the reduction of the amount of data actually transmitted is simply implemented, thereby saving the cost.

Figure 2:
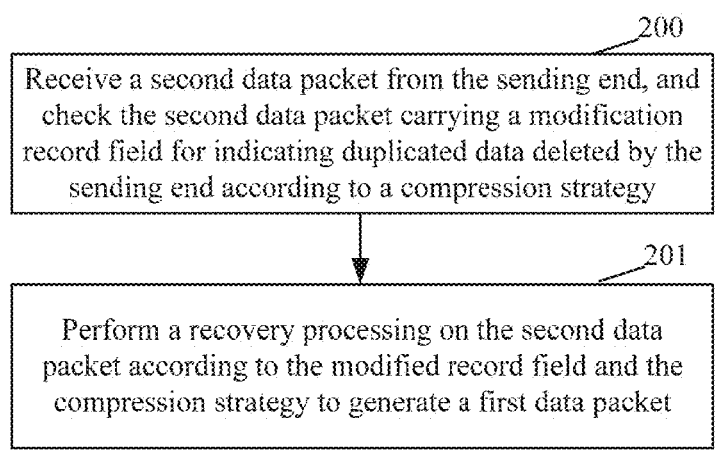
FIG. 2 is a flowchart of a data transmission method provided by another embodiment of the present disclosure.

FIG. 2 is a flowchart of a data transmission method provided by another embodiment of the present disclosure. The method shown in FIG. 2 may be applicable to the receiving end (such as a server end). As shown in FIG. 2, the method provided by this embodiment includes:

In step 200: a second data packet is received from the sending end, and the second data packet is checked to carry a modification record field for indicating duplicated data deleted by the sending end according to a compression strategy.

In step 201: a recovery processing is performed on the second data packet according to the modified record field and the compression strategy to generate a first data packet.

The modification record field may be configured at a start portion of a payload of the received second data packet. If the policy enable indication in the modification record field is valid, according to a source IP address of the second data packet, a policy type and policy number information in the modification record field, a corresponding compression strategy is searched at the receiving end and the recovery processing is performed on the second data packet by using the duplicated data specified by the compression strategy to generate the original first data packet.

In an embodiment, before the receiving end performs the recovery processing on the received second data packet, the method further includes: the receiving end sends a compression strategy to the sending end through a control path such as a preset port. In an embodiment, the receiving end receives confirmation information from the sending end. For example, if the server periodically sends a synchronization request message carrying a compression strategy to a client by a server periodicity of 2 seconds, it is considered that synchronization is completed when confirmation information (such as one synchronization request response message) is received from a terminal; if no acknowledgement information is received from the terminal (such as the synchronization request response message), the synchronization request message is continually sent until the terminal completes the synchronization and receives the synchronization request response message from the terminal.

In an embodiment, when the receiving end receives a query request from the sending end for querying whether the receiving end supports the compression transmission capability, if the receiving end supports, a query response is returned to the sending end.

Through the data transmission method provided by the embodiment of the present disclosure shown in FIG. 2, information repeatedly sent in the data packet to be sent is deleted, and the amount of data actually transmitted is reduced. The method provided by the embodiment of the present disclosure does not require additional hardware support, and simply reduces the amount of data actually transmitted, thereby saving the cost.

In the data transmission method of the embodiment of the present disclosure, the second data packet received from the sending end includes multiple second data packets.

The method provided by the embodiment includes that: the receiving end periodically detects the received multiple second data packets to generate a compression strategy; and sends the generated compression strategy including the specified duplicated data to the sending end through the control path. That is, synchronization of policies in the compression strategies between the receiving end and the sending end is implemented.

In an embodiment, the receiving end may adopt a learning manner to generate a compression strategy during the detection process. The learning of the data packet may be periodically or continuously sampled, a preset number of second data packets is compared filed by field, and same field information is extracted as duplicated data specified by the compression strategy; or a port of a specific application is sampled, if data portions of the preset number of second data packets continuously received from the port are compared, and a same data content in the data portions is extracted as the duplicated data specified in the compression strategy. For example, each time the server receives a preset number of consecutive data packets of a same protocol type, such as three, compares each field in the three data packets and extracts the same field information as the specified duplicated data included in the compression strategy; and samples a specific application port, such as a 2001 port, compares the data portions of the preset number of consecutive data packets received from this port, such as three, to extract the same data content as the specified duplicated data included in the compression strategy.

If a policy included in the compression policy at the receiving end changes, the method provided by the embodiment of the present disclosure may further include: the receiving end sends an update request message to the sending end, where the update request message carries new policy information such as a policy number corresponding to the changed policy, and a specific content of the new policy. That is, synchronization of policies in the compression strategies between the receiving end and the sending end is implemented.

The sending end receives the update request message, acquires the new policy information carried in the update request message, updates corresponding policy in the compression strategy, and returns an update request response to the receiving end.

In an embodiment, in order to avoid message sending failure due to network reasons, the server repeatedly sends the update request message to the terminal at a preset time interval (such as 2 seconds). Once the server receives the update request response from the terminal, the update is considered to be completed; if no update request response is received from the terminal, the server continually sends the update request message until the update request response is received from the terminal.

Through the data transmission method provided by the embodiment of the present disclosure shown in FIG. 2, information repeatedly sent in a data packet to be sent is deleted, and the amount of data actually transmitted is reduced. The amount of data actually transmitted is reduced and has a role of reducing the payload of the user plane of the operator network, thus the productization of technical solutions of the embodiment of the present disclosure is very easy. The method provided by the embodiment of the present disclosure is directly applied between two final nodes of the terminal and the server, and is also transparent to the network operator. Therefore, the method may be directly applied without requiring the operator to additionally add software and hardware costs or additional hardware support. Therefore, the reduction of the amount of data actually transmitted is simply implemented, thereby saving the cost.

The technical solution in the embodiment of the present disclosure will be described below in conjunction with embodiments.

Figures 3, 4:
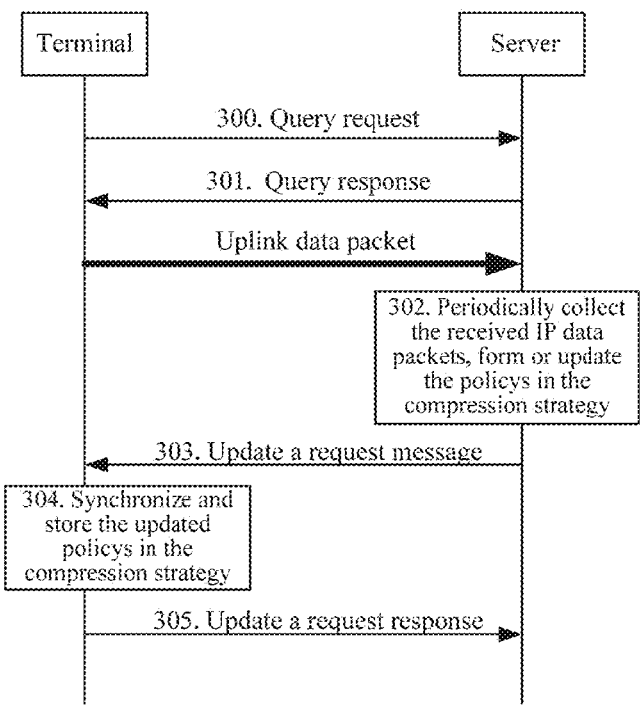
FIG. 3 is a flowchart of implementing compression transmission capability query and compression strategy synchronization in a data transmission method provided by an embodiment of the present disclosure.
FIG. 4 is a structure diagram of a protocol-type policy provided by an embodiment of the present disclosure.

FIG. 3 is a flowchart of implementing compression transmission capability query and compression strategy synchronization in a data transmission method provided by an embodiment of the present disclosure. In the embodiment, compression transmission capability query and compression strategy synchronization are implemented through control path. In the embodiment, it is assumed that the control path is defined by two specified ports, and data transmitted between the two ports is considered as control data. The data sent by the control channel is mainly a query request/a query response of the compression transmission capability between the terminal and the server, and a specific policy content when policies are synchronized. In this embodiment, after the policies are synchronized, a terminal and a server each have at most one pair of protocol-type policies and one pair of content-type policies. That is, one-to-one correspondent compression strategies exist between a pair of the terminal and the server. As shown in FIG. 3, the compression transmission capability query and compression strategy synchronization between the terminal and the server include:

in steps 300 to 301: before the terminal starts to communicate with a new server, the terminal sends a query request to the server through the control path to query whether the server supports the compression transmission capability; the server returns a query response to the terminal after receiving the query request.

In the embodiment, the terminal may communicate with through a preset port 3717 and a port 3718 of the server, which is regarded as the control path. The terminal sends a transmission control protocol (TCP) packet to the port 3718 of the server through the port 3717. A data portion of the TCP packet includes the query request. After the server receives the query request, the server returns a TCP packet to the terminal through the port 3718. The data portion of the TCP packet carries the query response, which means that the server supports compression transmission capability.

In an embodiment, in order to avoid message sending failure due to network status fluctuation, the terminal may send a preset number of query requests (such as three) at intervals (such as 2 seconds). If the terminal does not receive the query response from the server three times, it is considered that the server does not support the compression transmission capability; if the server supports the compression transmission capability, the server returns the query response such as an OK message to the terminal.

In steps 302 to 303: the server supporting the compression transmission capability periodically analyzes and collects the received IP data packets, forms or updates the policies in the compression strategy. If a policy in the compression strategy of the server changes, the server sends the update request message to the terminal. The update request message carries a policy number corresponding to the changed policy, and a specific content of the new policy.

In step 304, when receiving the update request message, the terminal acquires the new policy information carried in the update request message, updates corresponding policy in the compression strategy, and returns an update request response to the server.

In an embodiment, in order to avoid message sending failure due to network reasons, the server may repeatedly send the update request message to the terminal at a preset time interval (such as 2 seconds). Once the server receives the update request response from the terminal, the update is considered to be completed; if no update request response is received from the terminal, the server continually sends the update request message until the update request response is received from the terminal.

FIG. 4 is a structure diagram of a protocol-type policy according to an embodiment of the present disclosure. As shown in FIG. 4, the protocol-type policy may be embodied in the form of a policy table, which contains multiple protocol-type policies. The terminal maintains a protocol-type policy table for IP address of each server. The policies in the protocol-type policy table are for the same server. After the terminal ends communicating with the server, all policy information for the server is released. Multiple policies located in the same policy table have unique policy numbers for distinguishing the multiple policies. Similarly, the server also stores a protocol-type policy table similar to the content in the policy table stored in the terminal. The only difference is that an IP address of the policy table in the server is an IP address of the terminal. The server maintains a protocol-type policy table for each terminal, and the policy numbers and policy description in the policy table are consistent with those stored in the terminal. Taking FIG. 4 as an example, FIG. 4 lists three policies stored in the terminal. The types of these three policies are a hyper text transfer protocol (HTTP) GET request type, an Internet control message protocol (ICMP) Ping request type and a domain name system (DNS) request type. Each policy at most supports repeated description of two fields, which is described by a format of a field name/a length/a value (Field/Len/Value).

FIG. 5 is a structure diagram of a content-type policy provided by an embodiment of the present disclosure. As shown in FIG. 5, similar to the protocol-type policy, the content-type policy may be embodied in a form of the policy table. The terminal maintains a content-type policy table for each server IP address, which contains multiple content-type policies, and in the same policy, each policy is distinguished by a unique policy number.

When the server generates and maintains the content-type policies, the server maintains different content-type policy tables for terminals with different IP addresses. For the same terminal, the terminal distinguishes different data streams sent from different applications. Multiple methods for distinguishing the data streams are provided, such as adopting the port number. In a process of data interaction with a terminal, the server detects each port number, for example, a data packet received on a port M is matched by using a policy M, a data packet received on a port N is matched by using a policy N, which avoids the problem that every time a packet is received, all policies in the policy table needs to be traversed. In the content-type policy tables on the terminal and the server, a port number field is filled with a port number of the server. In addition, in the data transmission process in IoT applications, on a certain fixed type port, data of a fixed format and fixed information type is usually sent, such as GPS information, meter data, and vehicle status information, etc. Therefore, as shown in FIG. 5, a policy description method of the content-type policy table in the embodiment of the present disclosure may be described through an offset/a length/a value (Offset/Len/Value).

FIG. 6 is a structural diagram of decompression information according to an embodiment of the present disclosure. The decompression information may be carried in a one-byte modification record field of the second data packet to be sent. As shown in FIG. 6, FIG. 6 shows a field format of the modification record field. After the terminal of the embodiment of the present disclosure processes the first data packet to be sent by using the compression strategy, deletes the specified duplicated data included in the compression strategy in the first data packet, information of the one-byte modification record field and the modification record field is placed on a header of a data portion of the first data packet to generate the second data packet. After the server receives the second data packet, the server recovers the second data packet according to the information of the modification record field. Therefore, the modification record field is very important. Taking FIG. 6 as an example, the modification record field includes three fields. On field is a one-bit policy enable indication indicates whether the second data packet in which the modification record field is located has been processed by the processing performed by the compression strategy on the first data to be sent. In the embodiment, if the second data packet has been processed, the policy enable indication is valid and may be configured to be 1. If the second data packet has not been processed, the policy enable indication is invalid and may be configured to be 1. One field is a one-bit policy type indication, in the embodiment, the policy type indication is 0, indicating that a policy based on which the sending end processes the first data packet is the protocol-type policy, the policy type indication is 1, indicating that a policy based on which the sending end processes the first data packet is the content-type policy. One filed indicates a policy number of a policy which is used by the sending end to process the first data packet. To save space to the largest extent and considering the number of policies that may be used in the actual IoT scenarios, the maximum number of policies is configured to be 64 here, i.e., a value of the policy number ranges from 0 to 64. Therefore, the last 6 bits of the modification record field may be used for recording the policy numbers.

Figure 7:
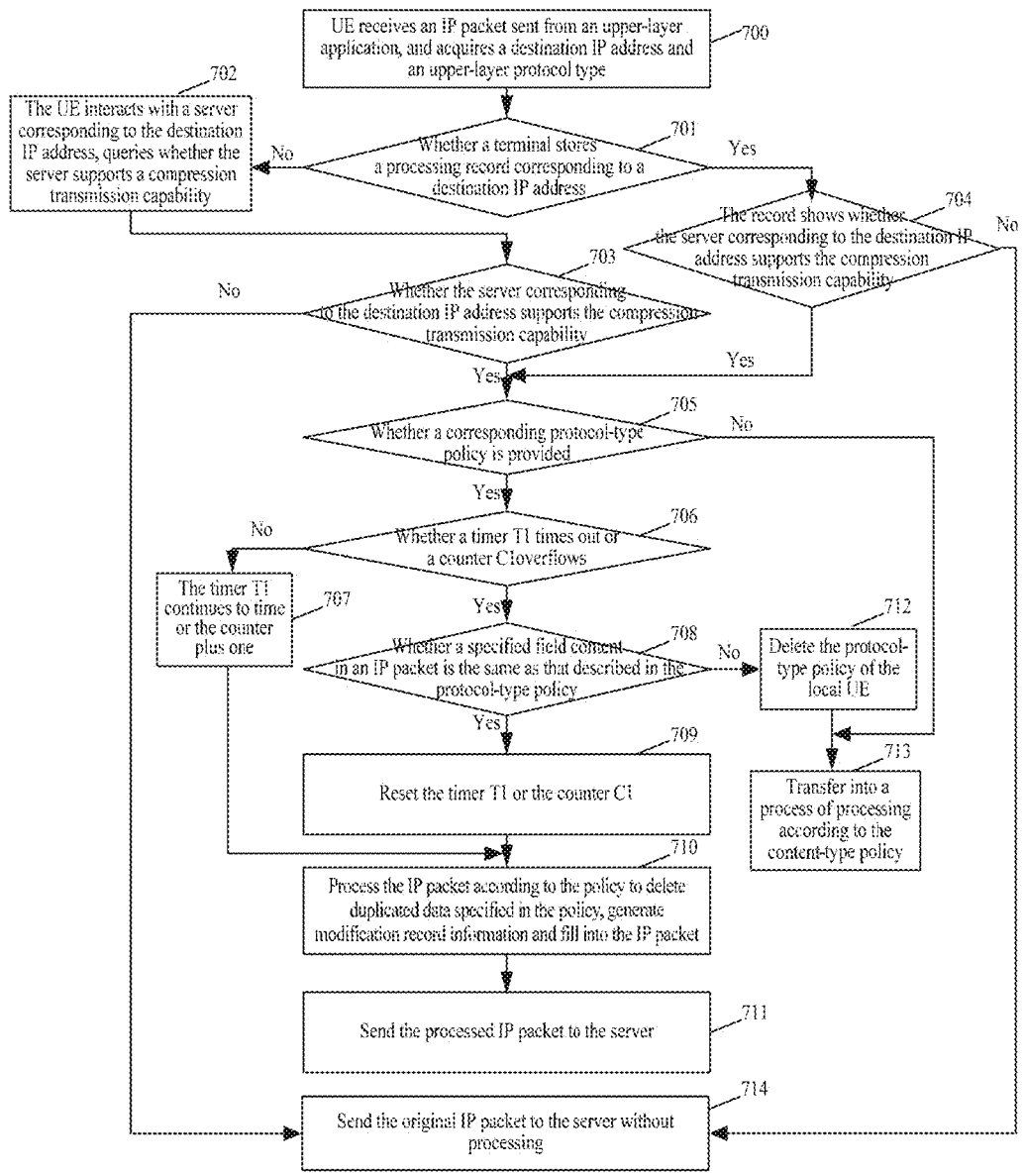
FIG. 7 is a flowchart of a data transmission method provided by another embodiment of the present disclosure.

FIG. 7 is a flowchart of a data transmission method provided by another embodiment of the present disclosure. In this embodiment, if a matched protocol-type policy is found, the first data packet to be sent firstly is processed by the protocol-type policy, and after processing, skips a content-type policy processing, the processed first data packet is directly generated into the second data packet and the second data packet is sent. If the matched protocol-type policy is not found, the process goes to the content-type policy processing. As shown in FIG. 7, the data transmission method in the embodiment may include the steps described below.

In step 700, the user equipment (UE) receives an IP packet sent from an upper-layer application, and acquires a destination IP address and an upper-layer protocol type.

In steps 701 to 702: whether the UE has a transmission record corresponding to the destination IP address is checked. If yes, the record is read and the process goes to the step 704. If no corresponding transmission record is provided, it indicates that the UE corresponds to the destination IP address for the first time, whether the server supports compression transmission needs to be queried and the process goes to the step 703.

In step 703: whether the server corresponding to the destination IP address supports the compression transmission capability is determined. If not, the process goes to the step 714; if yes, the process goes to the step 705.

In step 704: the record shows whether the server corresponding to the destination IP address supports the compression transmission capability. If the server supports the compression transmission capability, the process goes to the step 705; if the server does not support the compression transmission capability, the process goes to the step 714.

In step 705: whether the protocol-type policy corresponding to the destination IP address and the upper-layer protocol type exists is checked. If yes, the process goes to the step 706; if not, the process goes to the step 713.

In steps 706 to 707, whether a detection period has been reached is determined. In the embodiment of the present disclosure, whether the detection period has been reached may be determined by a timer T1 or a counter C1. If the detection period is not reached, no detection is performed and the process goes to the step 707 to continue timing or counting and the process goes to the step 710. If the detection period is reached, the process goes to the step 708.

In the embodiment, if a timer is used, it may be configured to perform detection once every 10 seconds; if a counter is used, it may be configured to perform detection once every 5 data packets. The specific threshold value may be changed by adjusting a value of a timer T1 or a counter C1 according to the application requirements.

In steps 708 to 709: a field content in the IP packet is detected to determine whether the field content is matched with contents of the Len and Value described in the corresponding protocol-type policy. If yes, the timer T1 or the counter C1 is reset and the process goes to the step 710; if not, the process goes to the step 712.

In step 710: the IP packet is processed according to the policies, the duplicated data is deleted, the modification record field is generated and filled into the original IP packet, and IP packet header information is modified and updated.

In step 711, the processed IP packet is sent to the server.

In step 712: the protocol-type policy of the local UE is deleted.

In step 713: it is proceeded to further process the IP packet according to the content-type policy.

In step 714: the original IP packet is sent to the server without processing. This process is ended. In this case, the ordinary data transmission method in the existing art may be adopted to send the data packet, i.e., the first data packet is directly sent to the receiving end without being processed.

Figure 8:
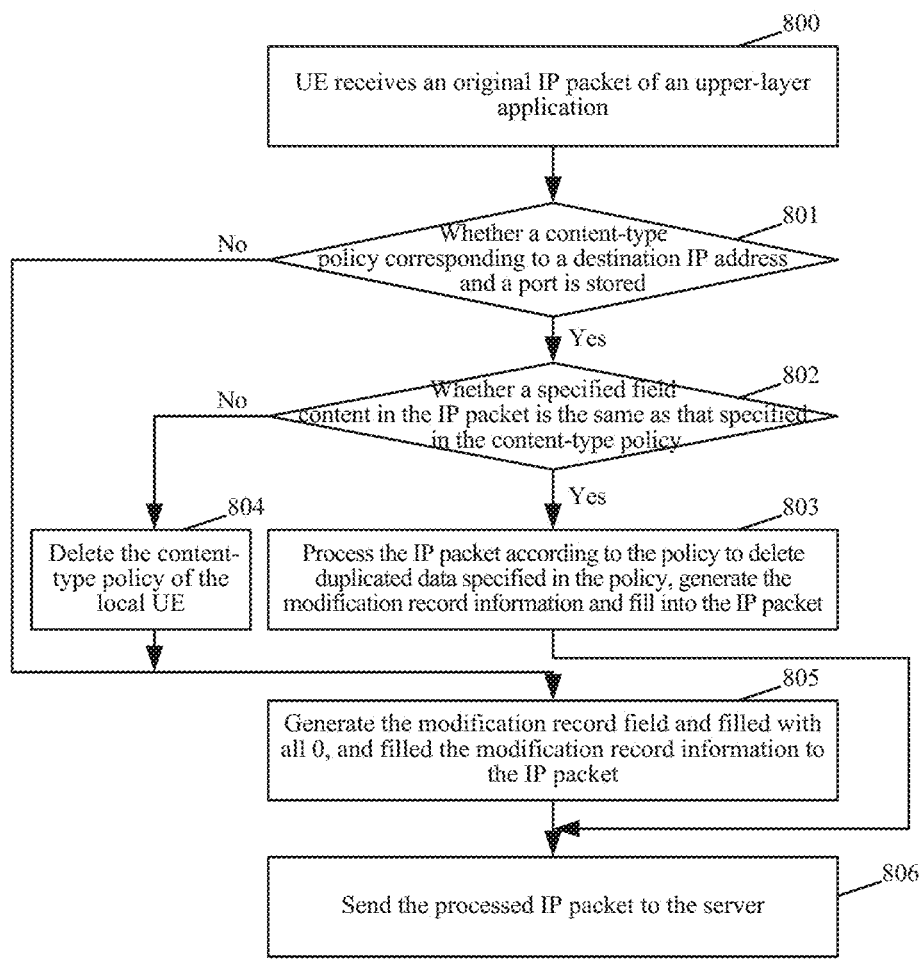
FIG. 8 is a flowchart of a data transmission method provided by another embodiment of the present disclosure.

FIG. 8 is a flowchart of a data transmission method provided by another embodiment of the present disclosure. The embodiment is a process of processing the data packet according to a content-type policy. The executed data packet shown in FIG. 8 is a data packet that has been filtered by the protocol-type policy and does not meet the requirement of the protocol-type policy. As shown in FIG. 8, the method provided by the embodiment includes following steps.

In step 800: a UE receives an original IP packet of an upper-layer application, and acquires a destination IP address and a port. Whether a content-type policy for the destination IP address and the port is provided is checked, if not, the process goes to the step 805; if the corresponding content-type policy is provided, the process goes to the step 802.

In step 802: whether a content of a specific position in the IP packet is the same as that described in the corresponding policy is checked. If yes, the process goes to the step 803; if not, the process goes to the step 804.

In step 803: the IP packet is processed according to the policy, duplicated data is deleted, a modification record field is generated and filled into the original IP packet, and then the process goes to the step 806.

In step 804: the content-type policy of the local UE is deleted.

In step 805: the modification record field is generated and filled with all 0, and the generated modification record field is filled into the original IP packet.

In step 806: the modified IP packet is sent to the server.

Applications of the solution provided by embodiment of the present disclosure will be described below in conjunction with actual scenarios. The UE in this embodiment uses a smart watch with a positioning function as an example for description. The watch periodically sends a latitude and a longitude of the UE to the server in a form of a user datagram protocol (UDP) packet. The watch also intermittently interacts with a network through an HTTP to acquire business contents such as newsletters. If the existing art is adopted, each data packet of the user's upper-layer application is sent to a network side through a radio protocol stack, i.e., the terminal sends as much data as the application generates. The solution provided by the embodiment of the present disclosure may significantly reduce the amount of data actually transmitted.

It is assumed that the user moves within a first ring by taking the Bell Tower in Shaanxi Province, Xi'an City as a center. A data packet fragment shown in Table 1 below is IP packet information sequentially sent by the smart watch to the network (in this embodiment, downlink data packets have been filtered out, only uplink data packets are shown here). Sequence numbers and timestamps are accumulated, a source IP address is an IP address of the terminal, and the destination IP address is an IP address of the server. A type indicates a protocol type above an IP layer. In the embodiment, the type includes two types: HTTP GET and UDP. An HTTP packet is used for communicating with a port 80 of the server to acquire miscellaneous business contents such as pictures and news. A UDP packet is a data packet sent by the terminal to the server at a port 2001. Information carried in the packet is in a fixed format and is GPS latitude and longitude information of the terminal, such as (34.2606986937, 108.9444049731). Data in these packets is shown below.

TABLE 1

| Sequence Number | Timestamp | Source Internet Protocol Address | Destination Internet Protocol Address | Type | Information |
|---|---|---|---|---|---|
| 1 | 24.482005 | 10.92.96.28 | 203.209.232.6 | HTTP GET | /a/i/mntl/ww/events/p.gif HTTP/1.1 |
| 2 | 25.600187 | 10.92.96.28 | 203.209.232.6 | HTTP GET | /a/combo?arc/yui/yui__0.2.4.j s HTTP/1.1 |
| 3 | 26.279093 | 10.92.96.28 | 203.209.232.6 | UDP | Source port: 59679 Destination port: 2001 |
| 4 | 28.067444 | 10.92.96.28 | 203.209.232.6 | UDP | Source port: 59679 Destination port: 2001 |
| 5 | 28.601732 | 10.92.96.28 | 203.209.232.6 | HTTP GET | /a/i/ww/news/2010/09/28/mc kinley-pd.jpg HTTP/1.1 |
| 6 | 29.789597 | 10.92.96.28 | 203.209.232.6 | UDP | Source port: 59679 Destination port: 2001 |
| 7 | 31.108169 | 10.92.96.28 | 203.209.232.6 | HTTP GET | /a/i/mntl/fm/10q1/finance__fp ad HTTP/1 |
| 8 | 33.017843 | 10.92.96.28 | 203.209.232.6 | UDP | Source port: 59679 Destination port: 2001 |

It is assumed that a payload content of a No. 1 HTTP packet in Table 1 is as follows.

Hypertext Transfer Protocol
  GET /a/i/mntl/ww/events/p.gif HTTP/1.1\r\n
    [Expert Info (Chat/Sequence) : GET /a/i/mntl/ww/events/p.gif HTTP/1.1\r\n]
      [GET /a/i/mntl/ww/events/p.gif HTTP/1.1\r\n]
      [Severity level: Chat]
      [Group: Sequence]
    Request Method: GET
    Request URI: /a/i/mntl/ww/events/p.gif
    Request Version: HTTP/1.1
Host: l.yimg.com\r\n
User-agent: Mozilla/5.0 (Windows; U; Windows NT 5.1; zh-CN; rv:1.9.2.8) Gecko/20100722 Firefox/3.6.8\r\n
Accept: image/png, image/*; q=0.8, */*; q=0.5\r\n
Accept-Language: zh-cn , zh; q=0.5\r\n
Accept-Encoding: gzip , deflate\r\n
Accept-Charset: GB2312,utf-8;q=0.7,*;q=0.7\r\n
Keep-Alive: 115\r\n
Connection: keep-alive\r\n Each line represents one field, to the left of the colon is a field name and to the right of the colon is a field value. It may be seen that the No. 1 HTTP data packet contains multiple fields, and each field contains specific information. For example, a User-Agent field describes what operation system (including a version number) and what browser (including a version number) information the terminal uses, information of an Accept-Charset field describes a character set supported by the browser, etc. A name and meaning of each field is standard specification of an HTTP protocol, which are not repeated herein.

It is assumed that a payload content of a No. 2 HTTP packet in Table 1 is as follows.

```
Hypertext Transfer Protocol
    GET /a/combo?arc/yui/yui_0.2.4.js HTTP/1.1\r\n
        [Expert Info (Chat/Sequence) : GET /a/combo?arc/yui/yui_0.2.4.js HTTP/1.1\r\n]
            [GET /a/combo?arc/yui/yui_0.2.4.js HTTP/1.1\r\n]
            [Severity level : Chat]
            [Group: Sequence]
        Request Method: GET
        Request URI: /a/combo?arc/yui/yui_0.2.4.js
        Request Version: HTTP/1.1
    Host: l.yimg.com\r\n
    User-agent: Mozilla/5.0 (Windows; U; Windows NT 5.1; zh-CN; rv:1.9.2.8) Gecko/20100722 Firefox/3.6.8\r\n
    Accept: */*\r\n
    Accept-Language: zh-cn , zh;q=0.5\r\n
    Accept-Encoding: gzip , deflate\r\n
    Accept-Charset: GB2312,utf-8;q=0.7,*;q=0.7\r\n
    Keep-Alive: 115\r\n
    Connection: keep-alive\r\n
```

It is assumed that a payload content of a No. 5 HTTP packet in Table 1 is as follows.

```
Hypertext Transfer Protocol
    GET /a/i/ww/news/2010/09/28/mckinley-pd. jpg HTTP/1.1\r\n
        [Expert Info (Chat/Sequence) : GET /a/i/ww/news/2010/09/28/mckinley-pd. jpg HTTP/1.1\r\n]
            [GET /a/i/ww/news/2010/09/28/mckin1ey-pd. jpg HTTP/1.1\r\n]
            [Severity level: Chat]
            [Group: Sequence]
        Request Method: GET
        Request URI: /a/i/ww/news/2010/09/28/mckinley-pd. jpg
        Request Version: HTTP/1.1
    Host: l1.yimg.com\r\n
    User-agent: Mozilla/5.0 (Windows; U; Windows NT 5.1; zh-CN; rv:1.9.2.8) Gecko/20100722 Firefox/3.6.8\r\n
    Accept: image/png, image/*;q=0.8 ,*/*; q=0.5\r\n
    Accept-Language: zh-cn , zh;q=0.5\r\n
    Accept-Encoding: gzip , deflate\r\n
    Accept-Charset: GB2312,utf-8;q=0.7,*;q=0.7\r\n
    Keep-Alive: 115\r\n
    Connection: keep-alive\r\n
```

When the server analyzes these data packets, it calculated that the User-Agent and Accept-Charset fields have not been changed. Therefore, the server generates an HTTP Get request and protocol-type policy information for the terminal corresponding to the source IP address, and synchronizes the protocol-type policy information to the terminal. After synchronization, the protocol-type policy information stored in the terminal is shown in table 2.

TABLE 2

| P-Table 1 (Destination IP: 203.209.232.6) |
| --- |
| P-Policy 1(Policy number is 1) |
| HTTP GET |
| "User-Agent" |
| 102 |
| "User-Agent: Mozilla/5.0 (Windows; U; Windows NT 5.1; zh-CN; rv: 1.9.2.8) Gecko/20100722 Firefox/3.6.8\r\n" |
| "Accept-Charset" |
| 44 |
| "GB2312,utf-8; q = 0.7, *; q = 0.7\r\n" |

As shown in Table 2, a policy, i.e., P-Policy1 is included, the protocol type of the policy P-Policy1 is the HTTP GET type, and policy description of two fields are further included, i.e., the User-Agent field and the Accept-Charset field, and contents of the two fields are listed in the policy.

Actually, the contents of the User-Agent field and the Accept-Charset field in the HTTP GET request sent to the server are unchanged.

In this case, in a subsequent process of the UE transmitting the No. 1, 2 or 5 HTTP packet that conforms to the HTTP GET type, the two fields in the HTTP packet are deleted by using the policy P-Policy1, and a one-byte modification record field is added to a first byte of the data portion of the payload of the HTTP packet to tell the server that this HTTP packet is compressed, and tells the server that which policy is used for processing the compression to facilitate server recovering at the same time. In the embodiment, it is assumed that a value of the modification record field is 0x81, and the distribution of each bit is shown in Table 3. A value of the policy enable indication is 1, which indicates that the HTTP packet has been compressed. A value of the policy type is 0, which indicates that a policy based on which the HTTP packet is compressed is a protocol-type policy. A policy number indicates a number of the policy, which is unified both in the UE and the server. In this embodiment, it is assumed that a policy number of the policy based on which the HTTP packet is compressed is 1.

TABLE 3

| 1 bit | 1 bit | 6 bit |
|---|---|---|
| Policy Enable Indication (1) | Policy Type (0) | Policy Number (1) |

Similarly, No. 3, 4 and 6 packets sent by the smart watch are UDP packets. It is assumed that GPS information of the terminal sent by the same application is sent to the port 2001 of the server 203.2209.232.6. Contents carried by these three UDP packets are as follows.

Figure 11:
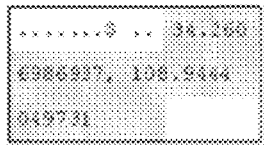
FIG. 11 is a schematic diagram of a table illustrating a data packet provided by an embodiment of the present disclosure.

FIG. 11 is a schematic diagram of a table illustrating a data packet provided by an embodiment of the present disclosure. It is assumed that latitude and longitude carried by the No. 3 UDP packet in Table 1 is (34.2606986937, 108.9444049731). As shown in the table in FIG. 11, it is assumed that the packet is located at No. 1 Beiyuanmen, Lianhu district, Xi'an, Shaanxi province.

Figure 12:
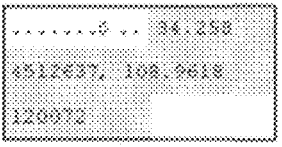
FIG. 12 is a schematic diagram of a table illustrating a data packet provided by an embodiment of the present disclosure.

FIG. 12 is a schematic diagram of a table illustrating a data packet provided by an embodiment of the present disclosure. It is assumed that latitude and longitude carried by the No. 4 UDP packet in Table 1 is (34.2584512637, 108.9444049731). As shown in the table in FIG. 12, it is assumed that the packet is located at No. 22 Xisandao lane, Beilin district, Xi'an, Shaanxi province.

Figure 13:
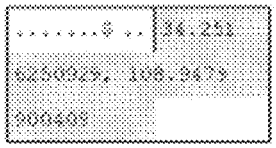
FIG. 13 is a schematic diagram of a table illustrating a data packet provided by an embodiment of the present disclosure.

FIG. 13 is a schematic diagram of a table illustrating a data packet provided by an embodiment of the present disclosure. It is assumed that latitude and longitude carried by the No. 6 UDP packet in Table 1 is (34.2516250929, 108.9479900409). As shown in the table in FIG. 13, it is assumed that the packet is located in the east of south Shuncheng road, Beilin district, Xi'an city, Shaanxi province.

The server periodically counts the UDP packets received on the port 2001. Content-type policy information is generated for the IP address of the terminal, and the content-type policy information is synchronized to the terminal, and the content-type policy information stored in the terminal is shown in table 7.

TABLE 7

| C-Table 1 (Destination IP: 203.209.232.6) |
|---|
| Policy C-Policy 1(Policy Number is 1) |
| 2001 (Port Number) |
| 8(Offset Value 1) |
| 4(Length 1) |
| "34.2" (Value 1) |
| 21(Offset value 2) |
| 6(Length 2) |
| ".108.9" (Value 2) |

As shown in Table 7, currently only one policy C-Policy1 with a policy number of 1 is provided. Policy C-Policy1 describes a situation of two content fields, which are located at two ends of data with an offset value of 8 and 21 and a length of 4 and 6 respectively. The contents are shown in Table 7, which are: "34.2" and "0.108.9" respectively. Two pieces of data are generated because a movement range of the user in a period of time is a movement range within the Bell Tower or city wall. This scenario is very common for the ordinary user that moves in a specific range for a period of time. Therefore, the content-type policy in this situation also is easy to be generated.

In this case, in a subsequent process of the UE transmitting the UDP packet that conforms to the policy C-Policy1, the two fields in the UDP packet are deleted by using the policy C-Policy1, and a one-byte modification record field is added to a first byte of the data portion of the payload of the UDP packet to tell the server that this UDP packet is compressed, and tells the server at the same time that which policy is used for performing the compression to facilitate the server recovering the UDP packet. In this embodiment, it is assumed that a value of the modification record field is 0xC1, and the distribution of each bit is shown in Table 8. A value of the policy enable indication is 1, which indicates that the UDP packet has been compressed. A value of the policy type is 1, which indicates that a policy used when the UDP packet is compressed is a content-type policy. A policy number indicates a number of the policy, which is unified both in the UE and the server. In this embodiment, it is assumed that a policy number 1.

TABLE 8

| 1 bit | 1 bit | 6 bit |
|---|---|---|
| Policy Enable Indication (1) | Policy Type (1) | Policy Number (1) |

Figures 14, 15, 16:
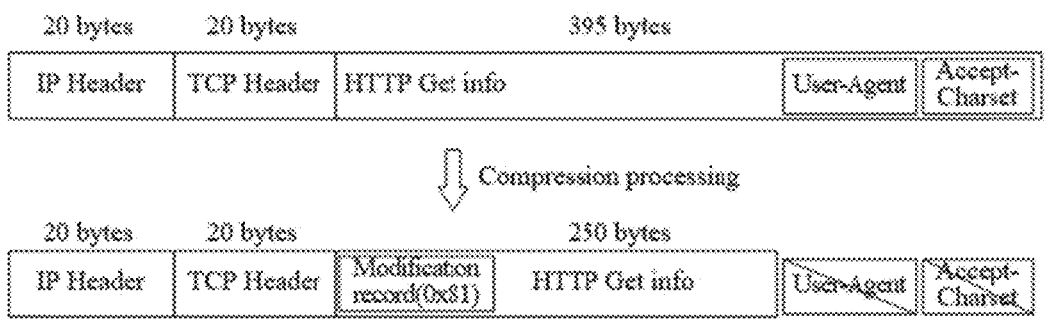
FIG. 14 is a schematic diagram of a table illustrating contents of an HTTP provided by an embodiment of the present disclosure.
FIG. 15 is a schematic diagram of a table illustrating a before and after compression situation provided by an embodiment of the present disclosure.
FIG. 16 is a schematic diagram of a table illustrating a processed UDP packet content provided by an embodiment of the present disclosure.

At this point, both policies have been generated. Then the server synchronizes the policies with the UE. FIG. 14 is a schematic diagram of a table illustrating contents of an HTTP provided by an embodiment of the present disclosure. After the policies are synchronized, when the UE sends the No. 7 HTTP packet, the HTTP packet is compressed according to the HTTP GET protocol-type policy, specified items in the protocol are removed, contents of the HTTP packet is processed, as shown in the table in FIG. 14. Information deleted in the table in FIG. 14 is not transmitted. Compared with the original data packet, a content of 145 bytes is not transmitted. That is, the processed data packet reduces 36.7% data amount. After a compression transmission scheme of the embodiment of the present disclosure is adopted, the duplicated content is removed and the transmission efficiency is improved.

FIG. 15 is a schematic diagram of a table illustrating a before and after compression situation provided by an embodiment of the present disclosure. From a perspective of the HTTP packet, a before and after compression situation is shown in the table in FIG. 15. Fields are slashed in the lower part of the table in FIG. 15.

Figure 17:
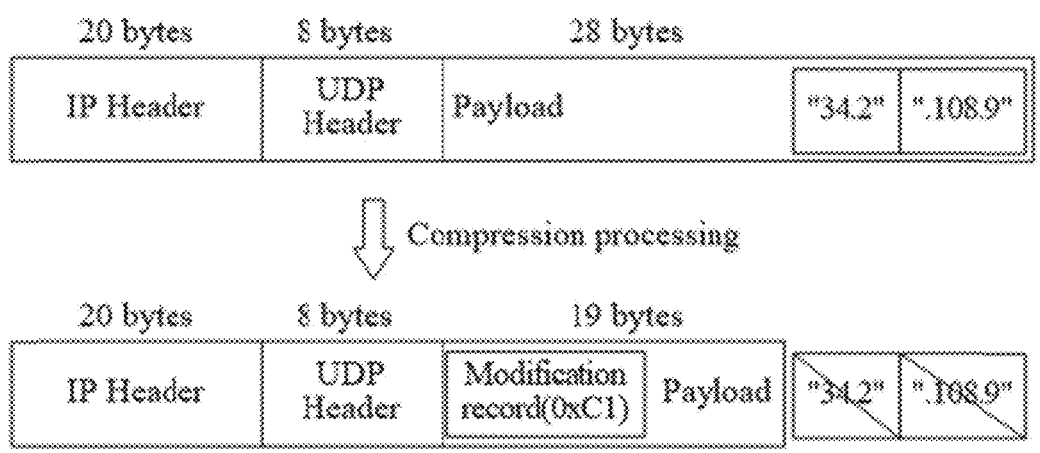
FIG. 17 is a schematic diagram of a table illustrating a before and after compression situation provided by an embodiment of the present disclosure.

When the UE sends the No. 8 UDP packet, the specified data is removed according to the content-type policy. FIG. 16 is a schematic diagram of a table illustrating a processed UDP packet content provided by an embodiment of the present disclosure. The processed UDP packet content is shown in the table in FIG. 16. Information crossed out in the table in FIG. 16 is not transmitted. FIG. 17 is a schematic diagram of a table illustrating a before and after compression situation provided by an embodiment of the present disclosure. As shown in the lower part of the table in FIG. 17, the data deleted in this embodiment is "34.2" and "0.108.9". Compared with the original data packet, a 9-byte content is not transmitted. That is, the processed UDP packet reduces 32.1% data amount. After a compression transmission scheme of the embodiment of the present disclosure is adopted, the duplicated data is removed and the transmission efficiency is improved.

In the technical solution in conjunction with the actual scenarios provided in the embodiment of the present disclosure, after the policies are generated, with the UE's continuous work, the number of data packets to be sent increases. The effect of saving resources by using the embodiment of the present disclosure becomes more and more significant.

In the above embodiment, the source address and the source IP address have the same meaning, and the destination address and the destination IP address have the same meaning.

An embodiment of the present disclosure further provides a computer-readable storage medium configured to store computer-executable instructions for executing the data transmission method provided by any embodiment of the present disclosure.

Figure 9:
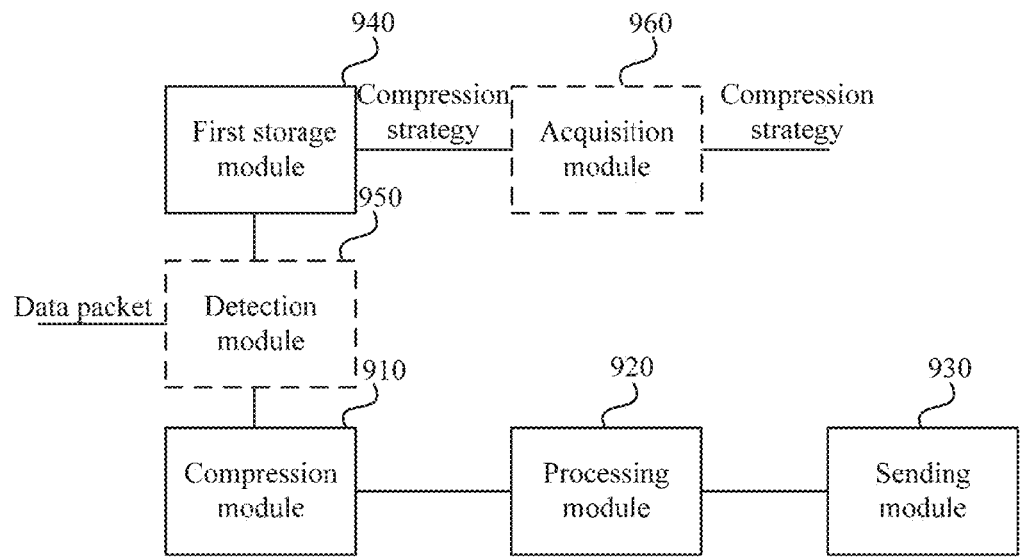
FIG. 9 is a schematic diagram of a data transmission device provided by an embodiment of the present disclosure.

FIG. 9 is a schematic diagram of a data transmission device provided by another embodiment of the present disclosure. As shown in FIG. 9, the device at least includes a compression module 910, a processing module 920 and a sending module 940 and a first storage module configured to store a compression strategy.

The compression module 910 is configured to process a first data packet to be sent by using a compression strategy in a first storage module 940, and delete specified duplicated data included in the compression strategy in the first data packet.

The processing module 920 is configured to generate a second data packet to be sent from the processed first data packet, where the second data packet includes a modification record field for indicating the duplicated data deleted by the compression strategy.

The sending module 930 is configured to send the second data packet.

In an embodiment, the compression strategy includes one or more policies to compare whether the first data packet to be sent by the sending end includes basis information having duplicated content with a previously sent data packet.

In an embodiment, the decompression module 910 is configured to:
when a first data packet to be sent is provided, periodically compare the first data packet with a policy of which a destination address is consistent with a destination address of the first data packet in the compression strategy, and check whether a field or a content which is the same as that described in a protocol-type policy exists in the first data packet;
if yes, that is, it is checked out that the specified field or content in the first data packet matches with the compression strategy, the field or the content which is the same as that described in the protocol-type policy existing in the first data packet is deleted, i.e., deleting the content being duplicated with that of the previously sent data packet in the first data packet.

In an embodiment, the compression module 910 is further configured to: if the field or content in the first data packet is checked to be different from that described in the policy, delete the policy in the compression strategy.

In an embodiment, the compression strategy at least includes: a protocol-type policy mainly distinguished by a protocol type, and a content-type policy mainly distinguished by an application type. Correspondingly, the compression module 910 is configured to: when a first data packet to be sent is provided, if the compression strategy stores a protocol-type policy of which a destination address is consistent with a destination address of the first data packet to be sent, periodically compare the first data packet to be sent with the protocol-type policy of which the destination address is consistent with the destination address of the first data packet to be sent in the compression strategy, and check whether a field or a content which is the same as that described in the protocol-type policy exists in the first data packet, if yes, i.e., if it is checked out the corresponding field or content in the first data packet matches with the compression strategy, delete the field or the content which is the same as that described in the protocol-type policy exists in the first data packet, i.e., deleting the content being duplicated with that of the previously sent data packet in the first data packet;
in response to determining that the compression strategy does not store the protocol-type policy of which the destination address is consistent with the destination address of the first data packet to be sent, but stores a content-type policy of which the destination address is consistent with the destination address of the first data packet to be sent, periodically compare the first data packet to be sent with the content-type policy of which the destination address is consistent with the destination address of the first data packet to be sent in the compression strategy, and check whether a specified content in the first data packet is the same as that described in the content-type policy; if yes, i.e., if it is checked out the field or content in the first data packet matches with the compression strategy, delete the corresponding field or content in the first data packet, i.e., deleting the content being duplicated with that of the previously sent data packet in the first data packet.

In an embodiment, the device provided by the embodiment of the present disclosure further includes a detection module 950, which is configured to confirm that the receiving end supports the compression transmission capability and if the receiving end supports the compression transmission capability, the compression module is triggered for processing.

In an embodiment, the detection module 950 is configured to send a query request to the receiving end, and after receiving a response from the receiving end, determine that the receiving end supports the compression transmission capability; or query a data transmission record with the receiving end, and determine that the receiving end supports the compression transmission capability according to the data transmission record.

In an embodiment, if no record of data transmission with the server is stored, it indicates that the terminal communicates with the destination IP address corresponding to the data packet to be sent for the first time, and queries whether the server supports the compression transmission capability through the control path: for the server supporting the compression transmission capability, the compression module 950 is triggered for processing, and when it confirmed that the receiving end does not support the compression transmission capability, the first data packet is not processed and is directly sent to the receiving end.

In an embodiment, in order to avoid message sending failure due to network reasons, querying whether the receiving end supports the compression transmission capability may further include: the sending end sends a preset number of query requests (such as three times) to the server according to a preset time interval (such as 2 seconds). If the sending end does not receive a query response, it is considered that the receiving end does not support the compression transmission capability; if the sending end receives at least one query response, it is considered that the receiving end supports the compression transmission capability. In an embodiment, the time interval and the number of sending may be configured according to application scenarios.

The device provided by the embodiment of the present disclosure further includes: an acquisition module 960 which is configured to acquire the compression strategy from the receiving end through the control path. That is, synchronization of policies in the compression strategies between the receiving end and the sending end is implemented.

In an embodiment, the acquisition module 960 is further configured to after obtaining the compression strategy, return confirmation information to the receiving end.

The control path is from a TCP/IP level, which distinguishes a path for transmitting actual user data; the control path does not refer to a control plane of a 3GPP radio protocol stack, and the control path still belongs to a user plane. Here, the control path may be determined through a preset fixed port.

In an embodiment, the modification record field is configured at a start portion of a payload of the second data packet.

In an embodiment, the modification record field may include: a policy enable indication, which is used for indicating whether the second data packet in which the modification record field is located has been processed by the step 100, for example, if the second data packet is processed, the policy enable indication is valid and may be configured to be 1; if the second data packet is not processed, the policy enable indication is invalid and may be configured to be 0;

a policy type indication, which is used for indicating a type of a policy adopted to process the first data packet, for example, the policy type indication is 0, indicating that the first data packet is processed by using the protocol-type policy, the policy type indication is 1, indicating that the first data packet is processed by using the content-type policy; and a policy number, which is used for indicating that which policy is adopted to process the first data packet.

In an embodiment, the sending module 930 may be an enhanced machine-type communication/narrowband Internet of Things (eMTC/NB-IoT) radio protocol stack.

Through the device for implementing data transmission provided by the embodiment of the present disclosure shown in FIG. 9, information repeatedly sent in a data packet to be sent is deleted, and the amount of data actually transmitted is reduced. The amount of data actually transmitted is reduced and has a role of reducing the payload of the user plane of the operator network, thus the productization of technical solutions provided by the embodiment of the present disclosure is very easy. The device of the embodiment of the present disclosure is directly applied between two final nodes of the terminal and the server, and is also transparent to the network operator. Therefore, the device may be directly applied without requiring the operator to additionally add software and hardware costs or additional hardware support. Therefore, the reduction of the amount of data actually transmitted is simply implemented, thereby saving the cost.

An embodiment of the present disclosure further provides a terminal, which includes any device related in FIG. 9 for implementing the data transmission.

Figure 10:
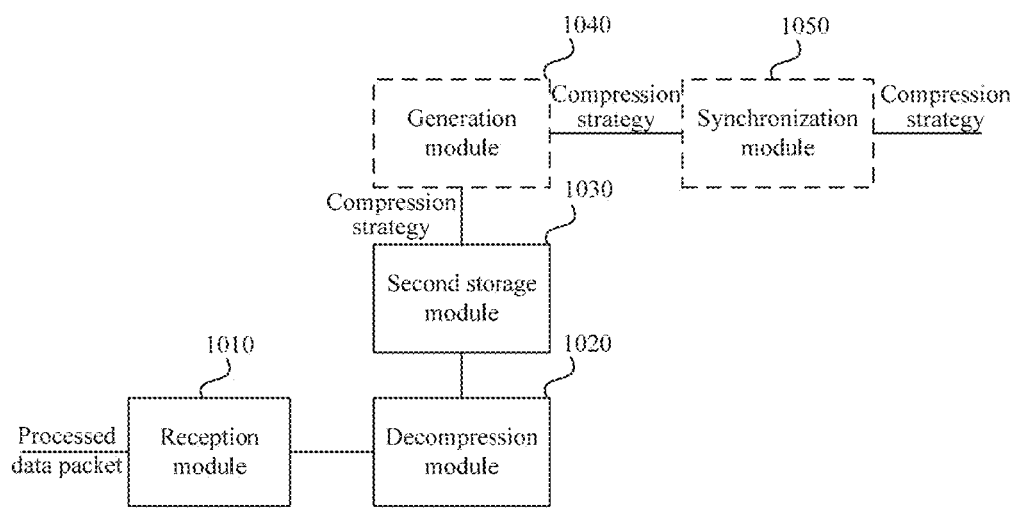
FIG. 10 is a schematic diagram of a data transmission device provided by another embodiment of the present disclosure.

FIG. 10 is a schematic diagram of a data transmission device provided by another embodiment of the present disclosure. As shown in FIG. 10, the device at least includes a reception module 1010, a decompression module 1020 and a second storage module 1030 configured to store a compression strategy.

The reception module 1010 is configured to receive a second data packet from a sending end, and check that the second data packet carries a modification record field which is used for indicating duplicated data deleted by the sending end according to a compression strategy.

The decompression module 1020 is configured to perform a recovery processing on the second data packet according to the modification record field and the compression strategy stored in the second storage module to generate a first data packet.

The device provided by the embodiment of the present disclosure further includes: a generation module 1040 and a synchronization module 1050.

The generation module 1040 is configured to periodically detect received packets and generate the compression strategy.

The synchronization module 1050 is configured to send the generated compression strategy including the specified duplicated data to a sending end through a control path.

In an embodiment, the generation module 1040 is configured to: periodically or continuously sample a preset number of second data packets, compare the preset number of second data packets filed-by-field, and extract same field information as duplicated data specified by the compression strategy; or sample a port of a specific application, compare data portions of the preset number of second data packets continuously received from the port, and extract a same data content in the data portions as the duplicated data specified in the compression strategy.

In an embodiment, the generation module 1040 is further configured to: change the compression strategy, and synchronize the updated compression strategy to the sending end.

In an embodiment, the decompression module 1020 is configured to: in response to determining that the policy enable indication in the modification record field is valid, according to a source IP address of the data packet and a policy type and policy number information in the modification record field, search the corresponding compression strategy stored in a server, and use the duplicated data specified by the compression strategy to recover the second data packet to generate the original first data packet.

An embodiment of the present disclosure further provides a server, which includes any device related in FIG. 10 for implementing the data transmission.

Embodiments of the present disclosure delete data repeatedly sent in the data packet to be sent, and the amount of data actually transmitted is reduced. At the same time, operators do not need to add additional software and hardware costs or additional hardware support. Therefore, the amount of data actually transmitted is reduced, thereby saving the cost.

What is claimed is:

1. A data transmission method, comprising:
   processing a first data packet to be sent by using a compression strategy obtained in advance from a receiving end, and deleting specified duplicated data comprised in the compression strategy in the first data packet;
   generating a second data packet to be sent from the processed first data packet, wherein the second data packet comprises a modification record field for indicating the deleted duplicated data; and
   sending the second data packet to the receiving end;
   wherein the modification record field is configured at a start portion of a payload of the second data packet;
   the modification record field comprises:
      a policy enable indication, which is used for indicating whether the second data packet in which the modification record field is located has been processed by a step processing the first data packet to be sent;
      a policy type indication, which is used for indicating a type of a policy adopted to process the first data packet; and
      a policy number, which is used for indicating a number of a policy adopted to process the first data packet.

2. The data transmission method of claim 1, wherein before processing the first data packet to be sent by using the compression strategy obtained in advance from the receiving end, the data transmission method further comprises: confirming that the receiving end supports compression transmission capability.

3. The data transmission method of claim 2, wherein confirming that the receiving end supports the compression transmission capability comprises:
   sending a query request to the receiving end, and after receiving a response from the receiving end, determining that the receiving end supports the compression transmission capability; or
   querying a data transmission record with the receiving end, and determining that the receiving end supports the compression transmission capability according to the data transmission record.

4. The data transmission method of claim 2, further comprising:
   in response to confirming that the receiving end does not support the compression transmission capability, not processing the first data packet to be sent and directly sending the first data packet to be sent to the receiving end.

5. The data transmission method of claim 1, wherein processing the first data packet to be sent by using the compression strategy obtained in advance from the receiving end, and deleting the specified duplicated data comprised in the compression strategy in the first data packet comprise:
   periodically comparing the first data packet with a policy of which a destination address is consistent with a destination address of the first data packet in the compression strategy, and checking whether a field or a content which is the same as that described in the policy exists in the first data packet;
   in response to determining that the field or the content which is the same as that described in the policy exists in the first data packet, deleting the field or the content which is the same as that described in the policy existing in the first data packet.

6. The data transmission method of claim 1, wherein the compression strategy comprises a protocol-type policy or a content-type policy; the protocol-type policy is a policy distinguished by a protocol type and the content-type policy is a policy distinguished by an application type;
   processing the first data packet to be sent by using the compression strategy obtained in advance from the receiving end, and deleting the specified duplicated data comprised in the compression strategy in the first data packet comprise:
      in response to determining that the compression strategy stores a protocol-type policy of which a destination address is consistent with a destination address of the first data packet, periodically comparing the first data packet with the protocol-type policy, and checking whether a field or a content which is the same as that described in the protocol-type policy exists in the first data packet, in response to determining that the field or the content which is the same as that described in the protocol-type policy exists in the first data packet, deleting the field or the content which is the same as that described in the protocol-type policy existing in the first data packet; or
      in response to determining that the compression strategy does not store the protocol-type policy of which the destination address is consistent with the destination address of the first data packet, but stores a content-type policy of which the destination address is consistent with the destination address of the first data packet, periodically comparing the first data packet with the content-type policy, and checking whether a content which is the same as that described in the content-type policy exists in the first data packet, in response to determining that the content which is the same as that described in the content-type policy exists in the first data packet, deleting the content being duplicated with that of a previously sent data packet in the first data packet.

7. A non-transitory computer-readable storage medium, which is configured to store computer-executable instructions for executing the method of claim 1.

8. A data transmission method, comprising:
   receiving a second data packet from a sending end, and checking out that the second data packet carries a modification record field which is used for indicating duplicated data deleted by the sending end according to a compression strategy obtained in advance;

performing a recovery processing on the second data packet according to the modification record field and the compression strategy to generate a first data packet;
wherein the modification record field is configured at a start portion of a payload of the second data packet;
the modification record field comprises:
  a policy enable indication, which is used for indicating whether the second data packet in which the modification record field is located has been processed by a step in which the sending end processes the first data packet to be sent;
  a policy type indication, which is used for indicating a type of a policy adopted to process the first data packet by the sending end; and
  a policy number, which is used for indicating a number of a policy adopted to process the first data packet by the sending end.

9. The data transmission method of claim 8, wherein the second data packet received from the sending end comprises a plurality of second data packets;
the data transmission method further comprises:
detecting the plurality of second data packets, generating the compression strategy comprising specified duplicated data and sending the generated compression strategy to the sending end.

10. The data transmission method of claim 9, wherein detecting the plurality of second data packets, and generating the compression strategy comprising specified duplicated data comprise:
  periodically or continuously sampling the plurality of second data packets, comparing a preset number of second data packets field by field, and extracting same field information as specified duplicated data comprised in the compression strategy; or
  sampling a port of a specific application, comparing data portions of a preset number of second data packets continuously received from the port, and extracting a same data content in the data portions as the specified duplicated data comprised in the compression strategy.

11. The data transmission method of claim 8, wherein in response to determining that a policy comprised in the compression strategy changes, the data transmission method further comprises:
  sending an update request message to the sending end, wherein the update request message carries a policy number corresponding to the changed policy and a content of a new policy.

12. The data transmission method of claim 8, wherein performing a recovery processing on the second data packet according to the modification record field and the compression strategy to generate a first data packet comprises:
  in response to determining that a policy enable indication in the modification record field is valid, according to a source address of the received second data packet and a policy type and a policy number in the modification record field, searching the compression strategy corresponding to the policy number, the policy type and the source address, and using the specified duplicated data of the compression strategy to recover the received second data packet to obtain the first data packet.

13. A data transmission device, comprising:
a compression module, a processing module, a sending module, and a first storage module configured to store a compression strategy; wherein
the compression module is configured to process a first data packet to be sent by using the compression strategy in a first storage module, and delete specified duplicated data comprised in the compression strategy in the first data packet;
the processing module is configured to generate a second data packet to be sent from the processed first data packet, wherein the second data packet comprises a modification record field for indicating the deleted duplicated data; and
the sending module is configured to send the second data packet;
wherein the modification record field is configured at a start portion of a payload of the second data packet;
the modification record field comprises:
  a policy enable indication, which is used for indicating whether the second data packet in which the modification record field is located has been processed by a step processing the first data packet to be sent;
  a policy type indication, which is used for indicating a type of a policy adopted to process the first data packet; and
  a policy number, which is used for indicating a number of a policy adopted to process the first data packet.

14. The data transmission device of claim 13, further comprising: a detection module, which is configured to confirm that a receiving end supports compression transmission capability and triggers the compression module to process.

15. The data transmission device of claim 14, wherein the detection module is configured to:
  send a query request to the receiving end, and after receiving a response from the receiving end, determine that the receiving end supports the compression transmission capability; or
  query a data transmission record with the receiving end, and determine that the receiving end supports the compression transmission capability according to the data transmission record.

16. The data transmission device of claim 14, wherein the detection module is further configured to: in response to confirming that the receiving end does not support the compression transmission capability, not process the first data packet to be sent and directly send the first data packet to be sent to the receiving end.

17. The data transmission device of claim 13, wherein the compression module is configured to:
  periodically compare the first data packet with a policy of which a destination address is consistent with a destination address of the first data packet in the compression strategy, and check whether a field or a content which is the same as that described in the policy exists in the first data packet;
  in response to determining that the field or the content which is the same as that described in the policy exists in the first data packet, delete the field or the content which is the same as that described in the policy existing in the first data packet.

18. The data transmission device of claim 13, wherein the compression strategy comprises a protocol-type policy or a content-type policy; the protocol-type policy is a policy distinguished by a protocol type and the content-type policy is a policy distinguished by an application type;
  the compression module is configured to:
    in response to determining that the compression strategy stores a protocol-type policy of which a destination address is consistent with a destination address of the first data packet, periodically comparing the first data packet with the protocol-type policy, and checking whether a field which is the same as that described in the protocol-type policy exists in the first data packet, in response to determining that the field which is the same as that described in the protocol-type policy exists in the first data packet, deleting the field which is the same as that described in the protocol-type policy existing in the first data packet; or in response to determining that the compression strategy does not store the protocol-type policy of which the destination address is consistent with the destination address of the first data packet, but stores a content-type policy of which the destination address is consistent with the destination address of the first data packet, periodically comparing the first data packet with the content-type policy, and checking whether a content which is the same as that described in the content-type policy exists in the first data packet, in response to determining that the content which is the same as that described in the content-type policy exists in the first data packet, deleting the content being duplicated with that of a previously sent data packet in the first data packet.

19. A terminal, comprising: the data transmission device of claim 13.

* * * * *